United States Patent
Lee et al.

(10) Patent No.: US 12,119,565 B2
(45) Date of Patent: Oct. 15, 2024

(54) ANTENNA SUBSTRATE

(71) Applicant: SAMSUNG ELECTRO-MECHANICS CO., LTD., Suwon-si (KR)

(72) Inventors: Yang Je Lee, Suwon-si (KR); Je Sang Park, Suwon-si (KR); Chang Gun Oh, Suwon-si (KR); Sang Ho Jeong, Suwon-si (KR); Hyun Kyung Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 225 days.

(21) Appl. No.: 17/747,659

(22) Filed: May 18, 2022

(65) Prior Publication Data
US 2023/0187830 A1 Jun. 15, 2023

(30) Foreign Application Priority Data

Dec. 14, 2021 (KR) ........................ 10-2021-0178705

(51) Int. Cl.
*H01Q 9/04* (2006.01)
*H01Q 1/22* (2006.01)
*H05K 1/02* (2006.01)
*H05K 1/11* (2006.01)

(52) U.S. Cl.
CPC ............. *H01Q 9/0407* (2013.01); *H01Q 1/22* (2013.01); *H05K 1/0243* (2013.01); *H05K 1/115* (2013.01)

(58) Field of Classification Search
CPC .......... H01L 23/53295; H01L 23/5226; H01L 21/76802; H01L 21/76804; H05K 1/113–115
See application file for complete search history.

(56) References Cited

U.S. PATENT DOCUMENTS

| | | | |
|---|---|---|---|
| 2015/0040389 A1* | 2/2015 | Ishiguro ............... | H05K 3/4697 29/832 |
| 2016/0043470 A1* | 2/2016 | Ko .......................... | H01Q 21/28 343/893 |
| 2016/0211586 A1 | 7/2016 | Hong et al. | |
| 2019/0267327 A1* | 8/2019 | Aoki ................... | H01L 21/4857 |
| 2022/0190479 A1* | 6/2022 | Lee ........................ | H05K 1/165 |
| 2023/0141412 A1* | 5/2023 | Kim ...................... | H05K 1/115 174/262 |

FOREIGN PATENT DOCUMENTS

| | | |
|---|---|---|
| KR | 10-2015-0032972 A | 4/2015 |
| KR | 10-2016-0016465 A | 2/2016 |

\* cited by examiner

*Primary Examiner* — Ricardo I Magallanes
*Assistant Examiner* — Aladdin Abdulbaki
(74) *Attorney, Agent, or Firm* — Morgan, Lewis & Bockius LLP (57) ABSTRACT

An antenna substrate includes a body in which a plurality of insulating layers are stacked, a first antenna layer including a plurality of first pattern layers disposed on the plurality of insulating layers and a plurality of first conductive via layer penetrating through the plurality of insulating layers to connect the plurality of first pattern layers in a stacking direction of the plurality of insulating layers and having a bar shape, and a second antenna layer extending from at least one of an uppermost portion or a lowermost portion of the first antenna layer on the insulating layer of the body.

20 Claims, 5 Drawing Sheets

ANTENNA SUBSTRATE

CROSS-REFERENCE TO RELATED APPLICATION

This application claims benefit of priority to Korean Patent Application No. 10-2021-0178705 filed on Dec. 14, 2021 in the Korean Intellectual Property Office, the disclosure of which is incorporated herein by reference in its entirety.

BACKGROUND

1. FIELD

The present disclosure relates to an antenna substrate.

2. DESCRIPTION OF RELATED ART

Mobile communications data traffic tends to increase rapidly every year. Active technological development is in progress to support such breakthrough data in real time in a wireless network. For example, applications such as Internet of things (IoT)-based data content, live VR/AR combined with augmented reality (AR), virtual reality (VR), and social networking service (SNS), autonomous driving, sync view (transmission of a user view point in real time using an ultra-small camera), require communications supporting exchange of large amounts of data. Therefore, millimeter wave (mmWave) communication including fifth-generation (5G) communication has recently been studied, and research for commercialization and standardization of antenna substrates for smoothly implementing millimeter wave communications has also been conducted.

SUMMARY

An aspect of the present disclosure may provide an antenna substrate capable of implementing an antenna having a vertical structure without a separate cable substrate.

An aspect of the present disclosure may also provide an antenna substrate capable of simultaneously implementing a patch antenna having a vertical structure and a horizontal structure with a single substrate.

According to an aspect of the present disclosure, an antenna substrate may include: a body including a plurality of insulating layers stacked therein; a first antenna layer including a plurality of first pattern layers disposed on the plurality of insulating layers, respectively, and a plurality of first conductive via layers respectively penetrating through the plurality of insulating layers to connect the plurality of first pattern layers in a stacking direction of the plurality of insulating layers and having a bar shape; and a second antenna layer extending from the plurality of first pattern layers in at least one of an uppermost portion or a lowermost portion of the first antenna layer, to have a radiation length in a horizontal direction perpendicular to the stacking direction and a width direction in which the second antenna layer extends.

According to another aspect of the present disclosure, an antenna substrate may include: a body including a plurality of insulating layers stacked in a stacking direction; a first antenna layer including a plurality of first pattern layers disposed on the plurality of insulating layers and a plurality of first conductive via layers penetrating through the plurality of insulating layers to connect the plurality of first pattern layers in the stacking direction and having a bar shape; and a second antenna layer extending in at least one of an uppermost portion or a lowermost portion of the first antenna layer on the insulating layers of the body, wherein each first pattern layer has a length larger than each first conductive via layer in a horizontal direction perpendicular to the stacking direction and a width direction in which the second antenna layer extends.

According to another aspect of the present disclosure, an antenna substrate may include: a body including a plurality of insulating layers stacked in a stacking direction; a first antenna layer including a plurality of first pattern layers disposed on the plurality of insulating layers, respectively, and a plurality of first conductive via layers respectively penetrating through the plurality of insulating layers to connect the plurality of first pattern layers in the stacking direction; and a second antenna layer extending in at least one of an uppermost portion or a lowermost portion of the first antenna layer on the insulating layers of the body. The plurality of first pattern layers are connected to each other in any cross-section of the first antenna layer that is cut in the stacking direction and a horizontal direction, the horizontal direction being perpendicular to the stacking direction and a width direction in which the second antenna layer extends.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

The embodiments of the present disclosure may be modified into other forms and are provided so that this disclosure will be thorough and complete and will fully convey the scope of the invention to those of ordinary skill in the art. In the drawings, the shapes and dimensions of elements may be exaggerated for clarity, and like reference numerals denote like elements.

In the present disclosure, the expression of "side portion," "side surface," and the like, are used to refer to a leftward/rightward direction or a surface in the corresponding direction in the drawings for the convenience sake, the expression of "upper side," "upper portion," "upper surface," and the like, are used to refer to upward direction or a surface in the corresponding direction in the drawings for the convenience sake, and the expression of "lower side," "lower portion," "lower surface," and the like, are used to refer to a downward direction or a surface in the corresponding direction in the drawings for the convenience sake. A notion that an element is disposed on a side portion, an upper side, an upper portion, a lower side, or a lower portion may include a configuration in which the element is directly in contact with an element configured as a reference in a corresponding direction, and a configuration in which the element is positioned in a corresponding direction but not in direct contact with the reference element. The terms may be defined as above for ease of description, and the scope of claims of the embodiments is not particularly limited to the above terms and the concept of upper and lower sides may be interchanged anytime.

In the present disclosure, the meaning of a "connection" of a component to another component includes an indirect connection through another element as well as a direct connection between two components. In addition, in some cases, the meaning of "connection" includes all "electrical connections".

It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

In the present disclosure, the expression of "example" may not refer to the same embodiment, but may be provided to describe and emphasize different unique features of each embodiment. The above suggested examples may not be excluded from implementation in combination with features of other examples. For example, even though the features described in one example are not described in the other examples, the description may be understood as relevant to the other example unless otherwise indicated.

The term "substantially the same" as used in the present disclosure does not mean the exact same, but means the same, including process errors or positional deviations occurring in a manufacturing process, and errors in measurement.

The terms used in the present disclosure are used to simply describe an example and are not intended to limit the present disclosure. A singular term includes a plural form unless otherwise indicated.

Exemplary embodiments of the present disclosure will now be described in detail with reference to the accompanying drawings.

Electronic Device System

Figure 1:
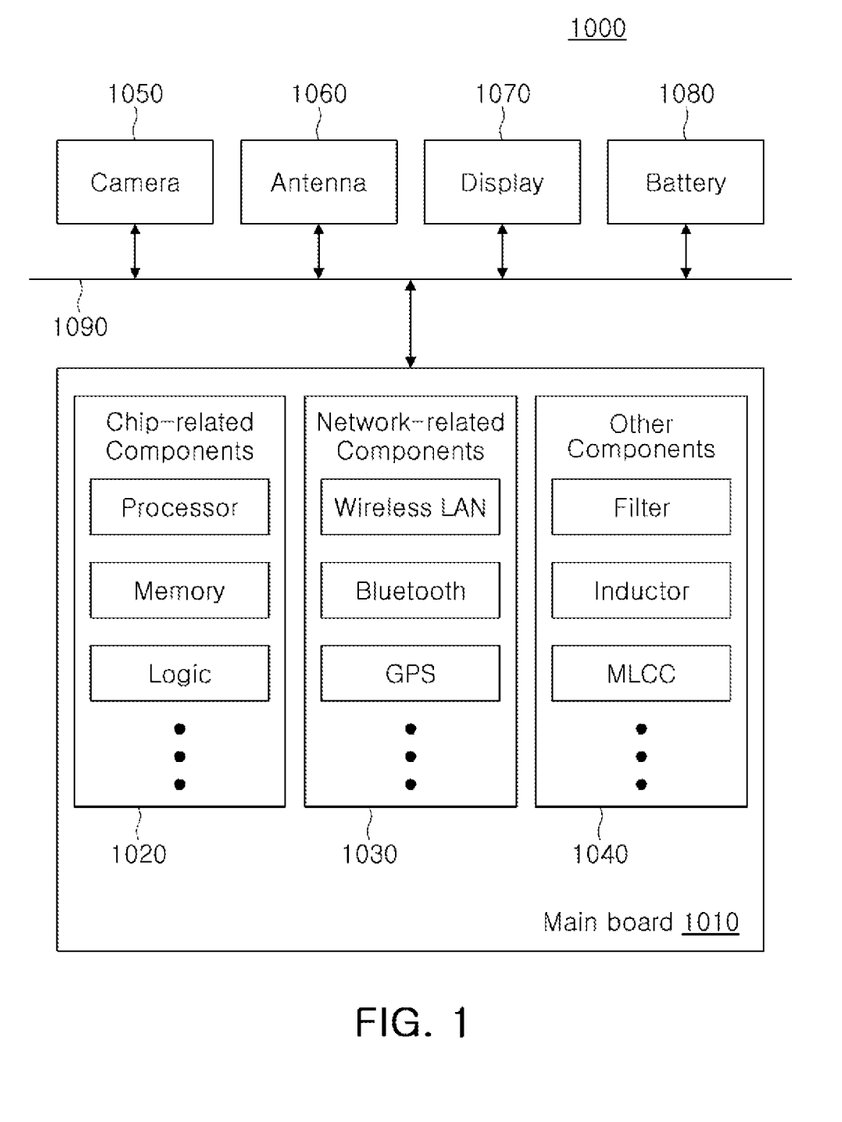
FIG. 1 is a block diagram schematically illustrating an example of an electronic device system.

FIG. 1 is a block diagram schematically illustrating an example of an electronic device system.

Referring to the drawing, an electronic device 1000 accommodates a main board 1010. A chip-related component 1020, a network-related component 1030, and other components 1040 are physically and/or electrically connected to the main board 1010. These are also combined with other electronic components to be described later to form various signal lines 1090.

The chip-related component 1020 may include a memory chip such as a volatile memory (e.g., DRAM), a non-volatile memory (e.g., ROM), and a flash memory; an application processor chip such as a central processor (e.g., CPU), a graphics processor (e.g., GPU), a digital signal processor, an encryption processor, a microprocessor, and a microcontroller; a logic chip such as an analog-to-digital converter and an application-specific IC (ASIC), but is not limited thereto and may include other types of chip-related electronic components. Also, these electronic components 1020 maybe combined with each other. The chip-related component 1020 may be in the form of a package including the chip or electronic component described above.

The network-related components 1030 include Wi-Fi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G and any other wireless and wired protocols designated thereafter, but are not limited thereto and may include any of wireless or wired standards or protocols. Also, the network-related component 1030 may be combined with the chip-related electronic component 1020.

Other components 1040 include a high frequency inductor, a ferrite inductor, a power inductor, ferrite beads, low temperature co-firing ceramics (LTCC), an electro magnetic interference (EMI) filter, a multi-layer ceramic condenser (MLCC), and the like. However, the present disclosure is not limited thereto, and in addition to this, a passive element in the form of a chip component used for various other purposes may be included. Also, it goes without saying that the other component 1040 may be combined with the chip-related electronic component 1020 and/or the network-related electronic component 1030.

Depending on a type of the electronic device 1000, the electronic device 1000 may include other electronic components that may or may not be physically and/or electrically connected to the main board 1010. Examples of other electronic components include a camera module 1050, an antenna module 1060, a display 1070, and a battery 1080. However, the present disclosure is not limited thereto, and other electronic components may include an audio codec, a video codec, a power amplifier, a compass, an accelerometer, a gyroscope, a speaker, a mass storage device (e.g. , a hard disk drive), a compact disk (CD), a digital versatile disk (DVD), etc. In addition, other electronic components used for various purposes may be included depending on the type of the electronic device 1000.

The electronic device 1000 includes a smartphone, a personal digital assistant, a digital video camera, a digital still camera, a network system, a computer, a monitor, a tablet, a laptop, netbook, a television, a video game, a smart watch, automotive, and the like. However, the present disclosure is not limited thereto, and may be any other electronic device that processes data in addition thereto.

Figure 2:
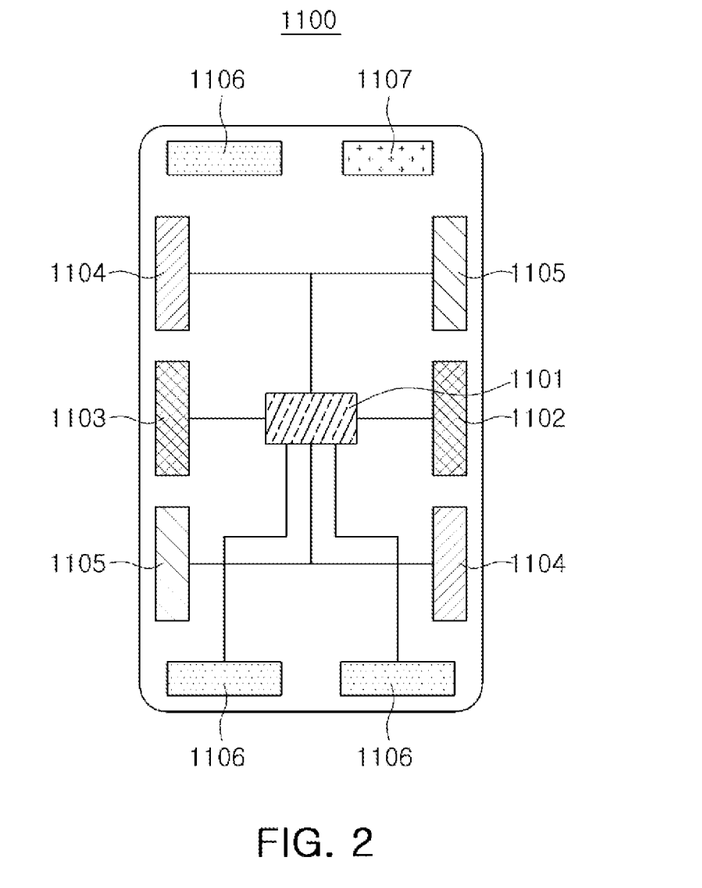
FIG. 2 is a perspective view schematically illustrating an example of an electronic device.

FIG. 2 is a plan view schematically illustrating an example of an electronic device.

Referring to the drawing, the electronic device may be, for example, a smartphone 1100. Inside the smartphone 1100, a model 1101 and various types of antenna modules 1102, 1103, 1104, 1105, and 1106 connected to the model 1101 through a rigid printed circuit board, a flexible printed circuit board, and/or a rigid-flexible printed circuit board may be disposed. If necessary, a Wi-Fi module 1107 may also be disposed. The antenna modules 1102, 1103, 1104, 1105, and 1106 may include antenna modules 1102, 1103, 1104, and 1105 of various frequency bands for 5G mobile communications, for example, the antenna module 1102 for a 3.5 GHz band frequency, the antenna module 1103 for a 5 GHz band frequency, the antenna module 1104 for a 28 GHz band frequency, the antenna module 1105 for a 39 GHz band frequency, etc., and may also include an antenna module 1106 for 4G, but is not limited thereto. Meanwhile, the electronic device is not necessarily limited to the smartphone 1100, and of course, it may be another electronic device as described above.

Antenna Substrate

Figure 3:
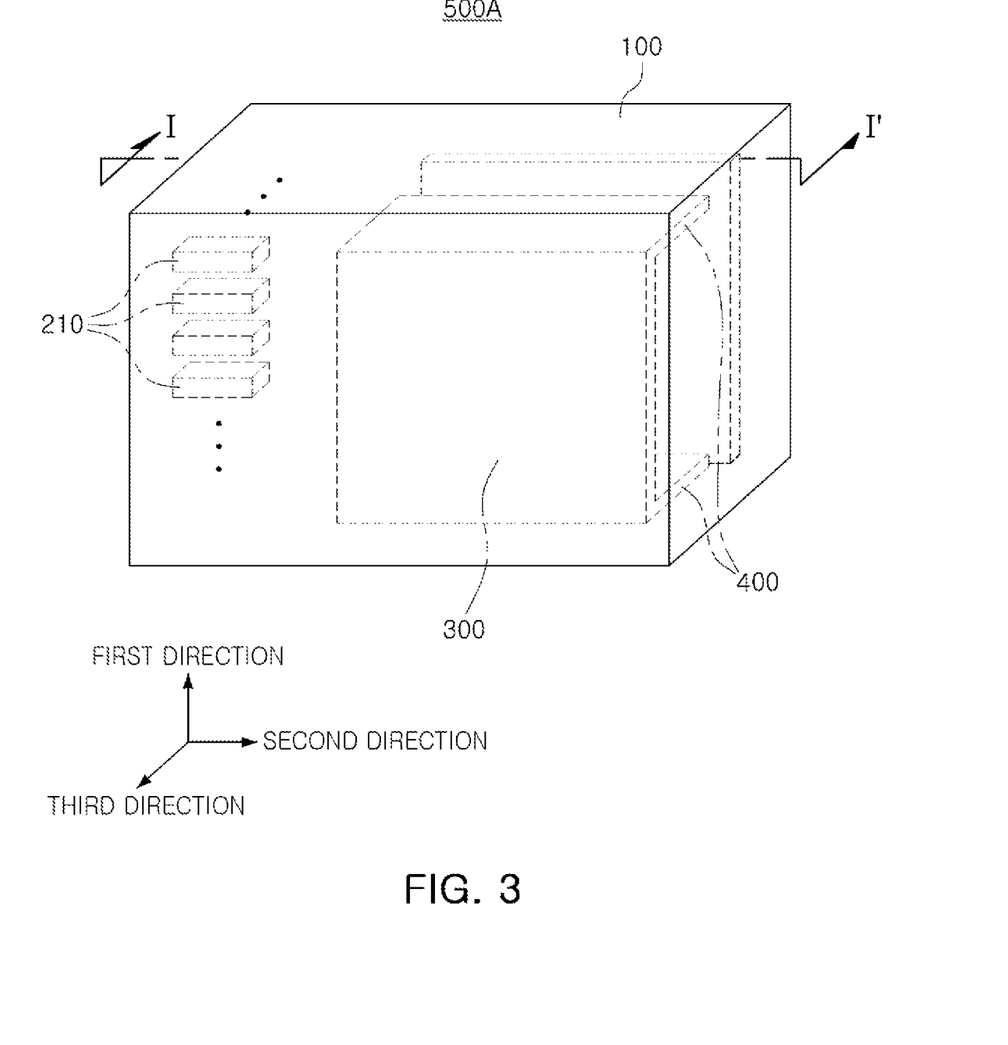
FIG. 3 is a perspective view schematically illustrating an example of an antenna substrate.
Figure 4:
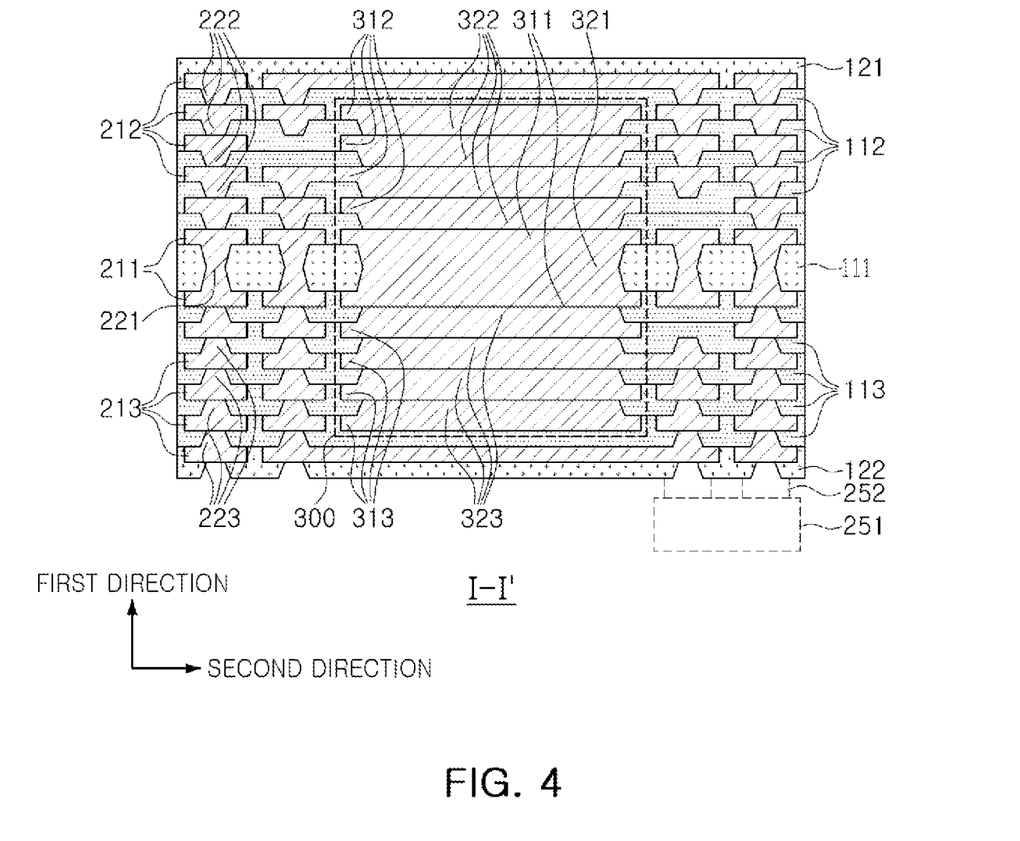
FIG. 4 is a schematic cross-sectional view taken along I-I' of the antenna substrate of FIG. 3.
Figure 5:
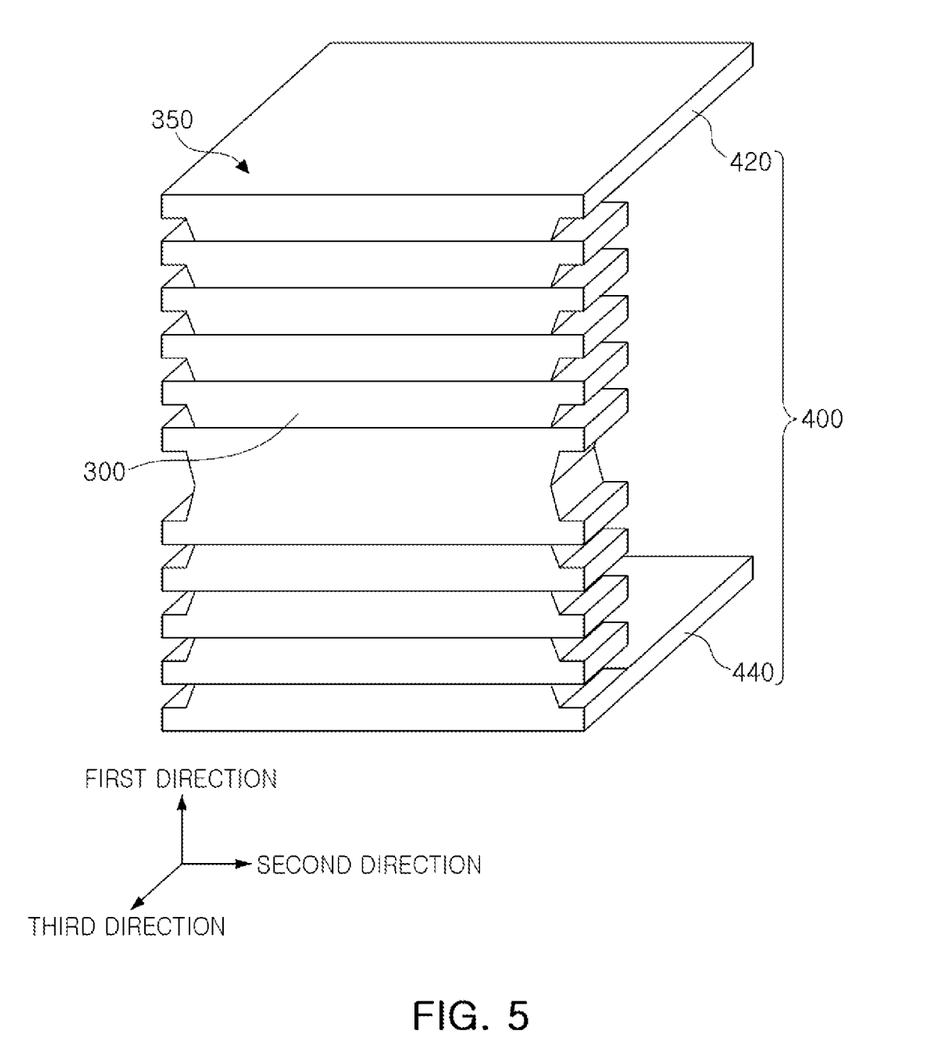
FIG. 5 is a perspective view schematically illustrating an example of a patch antenna layer having a vertical structure and a horizontal structure of FIG. 4.

FIG. 3 is a perspective view schematically illustrating an example of an antenna substrate, FIG. 4 is a cross-sectional view of the antenna substrate of FIG. 3, taken along line I-I', and FIG. 5 is a perspective view illustrating an example of a patch antenna layer having a vertical structure and a horizontal structure of FIG. 4.

First, when the direction is defined with reference to the drawing, a first direction with respect to an antenna substrate 500A may be designated as a direction defining a height or thickness of the antenna substrate 500A, and may be referred to as a vertical direction or a stacking direction of the substrate in the drawing. A second direction defines a length of the antenna substrate 500A and a third direction defines a width of the antenna substrate 500A. A length direction and a width direction may be changed according to a size of the printed circuit board, and the second direction indicating the length direction may be referred to as a horizontal direction in the drawing.

Referring to FIG. 3, an antenna substrate 500A according to an example includes a body 100 including an insulating material, a plurality of pattern layers 210 stacked in the first direction in the body 100, a first antenna layer 300 stacked in the third direction in the body 100, and a second antenna layer 400 extending in the third direction of the body 100 in at least one of the uppermost and lowermost portions of the first antenna layer 300. In this case, the first antenna layer 300 may have a structure erected in the first direction (vertical in the drawing) and may have a form in which, for example, a plurality of conductor structures 350, having a length in the second direction larger than a length in the third direction, are stacked in the first direction.

Meanwhile, in the case of an antenna substrate provided for a 5G antenna module, when mounted in a SET, 5G signal sensitivity is greatly affected depending on the direction of the antenna due to strong straightness of 5G. In order to cope with this, it may be considered to arrange three or more antenna modules including an antenna substrate for 5G in different directions. At this time, it may be necessary to arrange the antenna module vertically or horizontally in the set, and to this end, it may be considered to connect the antenna module to the set with a separate flexible printed circuit (FPC) cable board and arrange the antenna module. However, in this case, loss of signal characteristics may occur due to connection through a cable, and there is also a cost problem.

Meanwhile, in the antenna substrate 500A according to an example, as described above, the first antenna layer 300 disposed in the antenna substrate 500A may have a structure in which the first antenna layer 300 is erected in the first direction, and the second antenna layer 400 may have a horizontal structure extending in the third direction. Accordingly, when the antenna substrate 500A is applied to an antenna module for 5G and disposed in a set, a radiation pattern of an antenna having both a vertical structure and a horizontal structure may be realized without a separate FPC cable board. In this case, an antenna radiation patch structure having the vertical structure and the horizontal structure may be directly mounted, so that efficiency may be improved. In addition, it is significant in that an antenna having a stacked conductor structure 350 of a vertical structure is implemented using a substrate process. Through the substrate process, the vertical structure of the first antenna layer 300 may be easily implemented, and the first antenna layer 300 and the second antenna layer 400 having a large planar area may be more easily implemented.

Referring to FIGS. 4 and 5, the antenna substrate 500A according to an example includes the body 100, the first antenna layer 300, and the second antenna layer 400.

The body 100 includes a plurality of insulating layers 111, 112, and 113 stacked in a first direction. If necessary, the body 100 may further include a plurality of passivation layers 121 and 122 respectively disposed on the uppermost insulating layer 112 and the lowermost insulating layer 113 in the first direction, among the plurality of insulating layers 111, 112, and 113. The plurality of insulating layers 111, 112, and 113 may further include a core insulating layer 111 and a plurality of first and second buildup insulating layers 112 and 113 disposed on both sides of the core insulating layer 111 in the first direction. The core insulating layer 111 may be thicker than each of the first and second buildup insulating layers 112 and 113. However, the present disclosure is not limited thereto, and one of the core insulating layer 111 and the plurality of first and second buildup pattern layers 212 and 213 may be omitted, so that the antenna substrate 500A may have a form of a coreless substrate.

The plurality of insulating layers 111, 112, and 113 may each include an insulating material. As the insulating material, a thermosetting resin such as an epoxy resin, a thermoplastic resin such as polyimide, or a material including a reinforcing material such as a woven glass fiber and/or an inorganic filler, for example, prepreg, Ajinomoto buildup film (ABF), photo imageable dielectric (PID), etc. may be used together.

The plurality of insulating layers 111, 112, and 113 may each include a stack of a thermoplastic resin layer and a thermosetting resin layer. The thermoplastic resin layer may include a material effective for high-frequency signal transmission, and the thermosetting resin layer may include a material which is advantageous for high-frequency signal transmission and has excellent bonding properties. Through such a multilayer resin layer, an insulating body being advantageous for high-frequency signal transmission and having excellent adhesion may be provided.

As the thermoplastic resin layer, in terms of high-frequency signal transmission, liquid crystal polymer (LCP), polytetrafluoroethylene (PTFE), polyphenylene sulfide (PPS), polyphenylene ether (PPE), polyimide (PI), etc. may be used. A dielectric loss factor Df may be adjusted according to a type of the resin of the thermoplastic resin layer, a type of filler contained in the resin, the content of the filler, and the like. The dielectric loss factor Df is a value for the dielectric loss, and the dielectric loss means power lost when an alternating electric field is formed in the resin layer (dielectric). The dielectric loss factor Df is proportional to the dielectric loss, and as the dielectric loss factor Df is smaller, the dielectric loss is reduced. The thermoplastic resin layer having low dielectric loss characteristics is advantageous in terms of loss reduction in high-frequency signal transmission. The dielectric loss factor Df of the thermoplastic resin layer may be 0.003 or less, for example, 0.002 or less. In addition, a dielectric constant Dk of the thermoplastic resin layer may be 3.5 or less. Meanwhile, the dielectric constant Dk maybe measured through a vector network analyzer using a dielectric assessment kit (DAK), which is the same hereinafter, but is not limited thereto.

As the thermosetting resin layer, polyphenylene ether (PPE), modified polyimide (PI), modified epoxy, or the like may be used in terms of high-frequency signal transmission. The dielectric loss factor Df may be adjusted according to a type of a resin of the thermosetting resin layer, a type of a filler contained in the resin, the content of the filler, and the like. The thermosetting resin layer having low dielectric loss characteristics is advantageous in terms of loss reduction in high-frequency signal transmission. The dielectric loss factor Df of the thermosetting resin layer may be 0.003 or less, for example, 0.002 or less. In addition, the dielectric constant Dk of the thermosetting resin layer may be 3.5 or less.

A thickness of the thermoplastic resin layer may be thicker than a thickness of the thermosetting resin layer. In terms of high-frequency signal transmission, it may be more preferable to have such a thickness relationship. An interface between the vertically adjacent thermoplastic resin layer and the thermosetting resin layer may include a rough surface. The rough surface means a surface that has been roughened and has irregularities. According to such a rough surface, the thermoplastic resin layer and the thermosetting resin layer adjacent to each other may secure adhesion to each other.

The plurality of passivation layers 121 and 122 may protect the internal components of the antenna substrate 500A from external physical and chemical damage. Each of the plurality of passivation layers 121 and 122 may include a thermosetting resin. For example, each of the passivation layers 121 and 122 may be ABF. However, the present disclosure is not limited thereto, and each of the passivation layers 121 and 122 may be a known solder resist (SR) layer. In addition, if necessary, the passivation layers 121 and 122 may include a photo imageable dielectric (PID). The lower passivation layer 122 may have a plurality of openings.

The plurality of pattern layers 210 (211, 212, and 213) are stacked in the first direction in the plurality of insulating layers 111, 112, and 113. The plurality of pattern layers 211, 212, and 213 include the plurality of core pattern layers 211 and a plurality of first and second buildup patterns 212 and 213 disposed on both sides of the plurality of core pattern layers 211 in the first direction. The plurality of core pattern layers 211 are disposed on both surfaces of the core insulating layer 111 in the first direction. The plurality of first and second buildup pattern layers 212 and 213 are respectively disposed on the plurality of first and second buildup insulating layers 112 and 113 in the first direction. Meanwhile, when one of the core insulating layer 111 and the plurality of first and second buildup insulating layers 112 and 113 is omitted so that the antenna substrate 500A has the form of a coreless substrate, one of the plurality of core pattern layers 211 and the plurality of first and second buildup pattern layers 212 and 213 may be omitted.

Each of the plurality of pattern layers 211, 212, and 213 may include a metal material. The metal material may include copper (Cu), aluminum (Al), silver (Ag), tin (Sn), gold (Au), nickel (Ni), lead (Pb), titanium (Ti), or alloys thereof. The plurality of pattern layers 211, 212, and 213 may be formed by an additive process (AP), semi AP (SAP), modified SAP (MSAP), tenting (TT), etc., and as a result, each of the plurality of pattern layers 211, 212, and 213 may include a seed layer, which is an electroless plating layer, and an electrolytic plating layer formed based on the seed layer. The plurality of pattern layers 211, 212, and 213 may perform various functions according to a design of the corresponding layer. For example, the plurality of pattern layers 211, 212, and 213 may include a feed pattern. In addition, the plurality of pattern layers 211, 212, and 213 may include a ground pattern, a power pattern, a signal pattern, and the like. Each of these patterns may include a line pattern, a plane pattern, and/or a pad pattern. At least one of the plurality of pattern layers 211, 212, and 213 may be electrically connected to at least one of a plurality of first pattern layers 311, 312, and 313 to be described later of at least one of the plurality of antenna layers 200. The pattern layers 211, 212, and 213 may be referred to as second pattern layers corresponding to the first pattern layers 311, 312, and 313.

The plurality of conductive via layers 221, 222, and 223 penetrate through the plurality of insulating layers 111, 112, and 113 in the first direction to connect the plurality of second pattern layers 211, 212, and 213 to each other. The plurality of conductive via layers 221, 222, and 223 include a core conductive via layer 221 and a plurality of first and second buildup conductive via layers 222 and 223 disposed on both sides of the core conductive via layer 221 in the first direction. The core conductive via layer 221 penetrates through the core insulating layer 111 in the first direction and connects the plurality of core pattern layers 211 disposed on both surfaces of the core insulating layer 111 to each other. The plurality of first and second buildup conductive via layers 222 and 223 penetrate through the plurality of first and second buildup insulating layers 112 and 113, respectively, in the first direction and connect the plurality of first and second buildup pattern layers 212 and 213 and the plurality of core pattern layers 211 to each other. Meanwhile, when one of the core insulating layer 111 and the plurality of first and second buildup insulating layers 112 and 113 is omitted so that the antenna substrate 500A has a form of a coreless substrate, one of the core conductive via layer 221 and the plurality of first and second buildup conductive via layers 222 and 223 may be omitted.

The plurality of second pattern layers 211, 212, and 213 are spaced apart from the first pattern layers 311, 312, and 313 on a cross-section of the body 100, and are stacked in the first direction in the plurality of insulating layers 111, 112, and 113. The plurality of conductive via layers 221, 222, and 223 may be referred to as a plurality of second conductive via layers 221, 222, and 223 corresponding to the first conductive via layers 321, 322 and 323, and the plurality of second conductive via layers 221, 222, and 223 penetrate through the insulating layers 111, 112, and 113 in the first direction to connect the second pattern layers 211, 212, and 213 to each other.

The plurality of second conductive via layers 221, 222, and 223 may include a metal material. The metal material includes copper (Cu), aluminum (Al), silver (Ag), tin (Sn), gold (Au), nickel (Ni), lead (Pb), titanium (Ti), or alloys thereof. The plurality of second conductive via layers 221, 222, and 223 may also be formed by a plating process such as AP, SAP, MSAP, TT, etc. As a result, the plurality of second conductive via layers 221, 222, and 223 may include a seed layer, which is an electroless plating layer, and an electrolytic plating layer formed based on the seed layer. The plurality of second conductive via layers 221, 222, and 223 may perform various functions according to a design. For example, the plurality of second conductive via layers 221, 222, and 223 may include a feed via for connection of a feed pattern, a signal via for signal connection, a ground via for ground connection, a power via for power connection, and the like. Each of these vias may be completely filled with a metal material, or the metal material may be formed along the wall surface of the via hole. In addition, the vias may have various shapes, such as a tapered shape and an hourglass shape.

The first antenna layer 300 includes a plurality of first pattern layers 311, 312, and 313 stacked in a first direction inside the plurality of insulating layers 111, 112, and 113, respectively, and a plurality of first conductive via layers 321, 322, and 323 penetrating through the plurality of insulating layers 111, 112, and 113 in the first direction and connecting the plurality of first pattern layers 311, 312, and 313 to each other. The plurality of first pattern layers 311, 312, and 313 have a length sufficient to have a radiation length in the second direction of the body 100. The plurality of first conductive via layers 321, 322, and 323 are disposed in the form of stacked vias with the plurality of first pattern layers 311, 312, and 313 interposed therebetween. The first pattern layers 311, 312, and 313 have a larger length in the second direction than the first conductive via layers 321, 322, and 323.

The second antenna layer 400 extends in the third direction (width direction) of the body 100 on at least one of an upper surface of the uppermost insulating layer or a lower surface of the lowermost insulating layer of the first antenna layer 300. In the first direction, the second antenna layer 400 has a smaller length than the first antenna layer 300. Also, in the first and second directions, a cross-sectional area of the first antenna layer 300 is larger than that of the second antenna layer 400 when viewed in cross-section. In one embodiment, the second antenna layer 400 may include an upper antenna layer 420 extending in the third direction in the uppermost portion of the first antenna layer 300 and a lower antenna layer 440 extending in the third direction in the lowermost portion of the first antenna layer 300. The upper antenna layer 420 may extend from the uppermost layer of the plurality of first pattern layers 311, 312, and 313, and the lower antenna layer 440 may extend from the lowermost layer of the plurality of first pattern layers 311, 312, and 313.

The second antenna layer 400 is patterned in a shape of a patch antenna having a length and thickness capable of receiving a constant radiation signal on one insulating layer or a plurality of insulating layers.

The conductor structure 350 may have a shape in which the first pattern layers 311, 312, and 313 adjacent to each other in the first direction and the first conductive via layers 321, 322, and 323 are integrally connected to each other. For example, in the core region, two core pattern layers 311 and one core via layer 321 therebetween maybe integrally connected to each other to form a conductor structure 350. In addition, in the buildup region, one first buildup pattern layer 312 and one first buildup conductive via layer 322 adjacent thereto or one second buildup pattern layer 313 and one second buildup conductive via layer 323 adjacent thereto may be integrally connected to each other to configure the conductor structure 350. Through this, each of the first antenna layers 300 may have a vertical structure erected in the first direction, and a planar area when viewed in the third direction may be wider than that when viewed in the first direction. At least some of the plurality of first antenna layers 300 may overlap each other in the third direction to constitute a patch antenna.

The plurality of first pattern layers 311, 312, and 313 includes the core pattern layer 311 and a plurality of first and second buildup pattern layers 312 and 313 disposed on both sides of the core pattern layer 311 in the first direction. The core pattern layer 311 is disposed on both surfaces of the core insulating layer 111 in the first direction. The plurality of first and second buildup pattern layers 312 and 313 are respectively disposed on the plurality of first and second buildup insulating layers 112 and 113 in the first direction. Meanwhile, when one of the core insulating layer 111 and the plurality of first and second buildup insulating layers 112 and 113 is omitted so that the antenna substrate 500A has the form of a coreless substrate as described above, one of the core pattern layer 311 and the plurality of first and second buildup pattern layers 312 and 313 may be omitted similarly.

The plurality of first pattern layers 311, 312, and 313 may include a metal material. The metal material may include copper (Cu), aluminum (Al), silver (Ag), tin (Sn), gold (Au), nickel (Ni), lead (Pb), titanium (Ti), or alloys thereof. Each of the plurality of first pattern layers 311, 312, and 313 may be formed by AP, SAP, MSAP, TT, etc., and as a result, each of the plurality of first pattern layers 311, 312, and 313 may include a seed layer, which is an electroless plating layer, and an electrolytic plating layer formed based on the seed layer. Each of the plurality of first pattern layers 311, 312, and 313 may have a bar shape in which a length in the second direction is larger than a length in the third direction. In addition, the length of the plurality of conductive via layers 321, 322, and 323 in the second direction is larger than the length in the first direction perpendicular thereto.

The plurality of first conductive via layers 321, 322, and 323 include the core via layer 321 and the plurality of first and second buildup via layers 322 and 323 disposed on both sides of the core via layer 321 in the first direction. The core via layer 321 penetrates through the core insulating layer 111 in the first direction and connects the plurality of core pattern layers 311 disposed on both surfaces of the core insulating layer 111 to each other. The plurality of first and second buildup via layers 322 and 323 penetrate through the plurality of first and second buildup insulating layers 112 and 113 in the first direction, and connect the plurality of first and second buildup pattern layers 312 and 313 and the plurality of core pattern layers 311 to each other. Meanwhile, when one of the core insulating layer 111 and the plurality of first and second buildup insulating layers 112 and 113 is omitted so that the antenna substrate 500A has a form of a coreless substrate as described above, one of the core via layer 321 and the plurality of first and second buildup via layers 322 and 323 may be omitted. As described above, the first conductive via layers 321, 322, and 323 are disposed in a stack via shape with the first pattern layers 311, 312, and 313 interposed therebetween in the first direction.

Each of the plurality of first conductive via layers 321, 322, and 323 may include a metal material. The metal material includes copper (Cu), aluminum (Al), silver (Ag), tin (Sn), gold (Au), nickel (Ni), lead (Pb), titanium (Ti), or alloys thereof. The plurality of via layers 321, 322, and 323 may also be formed by a plating process such as AP, SAP, MSAP, TT, etc. and, as a result, the plurality of via layers 321, 322, and 323 may include a seed layer, which is an electroless plating layer, and an electrolytic plating layer formed based on the seed layer. Each of the conductive vias of the plurality of first conductive via layers 321, 322, and 323 may have a bar shape in which a length in the second direction is larger than a length in the third direction. In this case, the side surface of each conductive via layer may have a tapered shape or an hourglass shape in the first direction. In the plurality of first conductive via layers 321, 322, and 323, portions close to the first pattern layers 311, 312, and 313 have a larger length than portions far from the first pattern layers 311, 312, and 313.

If necessary, an electronic component 251 may be disposed on the body 100, for example, on the passivation layer 122 on the lower side in the first direction in a surface-mounted manner. In this case, the antenna substrate 500A may function as an antenna module. The electronic component 251 may be electrically connected to at least some of the plurality of pattern layers 211, 212, and 213 through a connection metal 252 formed in an opening of the lower passivation layer 122. In this case, the electronic component 251 may also be electrically connected to at least one of the plurality of antenna layers 300.

The electronic component 251 may include at least one of a power management integrated circuit (PMIC), a radio frequency integrated circuit (RFRC), and a passive component. The passive component may be a chip-type passive component, for example, a chip-type capacitor or a chip-type inductor, but is not limited thereto. The connection metal 252 may be formed of a low-melting-point metal having a lower melting point than copper (Cu), for example, tin (Sn) or an alloy including tin (Sn). For example, the connection metal 252 may be formed of solder, but this is only an example and the material is not limited thereto.

According to the antenna substrate of the present disclosure, an antenna having a vertical structure may be implemented without a cable substrate.

In addition, according to the antenna substrate of the present disclosure, a patch having a vertical structure and a horizontal structure maybe implemented with one substrate, and through this, radiation signals of various frequency bands may be received even in a situation in which a thickness of a substrate is required to be small.

While exemplary embodiments have been shown and described above, it will be apparent to those skilled in the art that modifications and variations could be made without departing from the scope of the present disclosure as defined by the appended claims.

What is claimed is:

1. An antenna substrate comprising:
   a body including a plurality of insulating layers stacked therein;
   a first antenna layer including a plurality of first pattern layers disposed on the plurality of insulating layers, respectively, and a plurality of first conductive via layers respectively penetrating through the plurality of insulating layers to connect the plurality of first pattern layers in a stacking direction of the plurality of insulating layers, each of the plurality of first conductive via layers having a bar shape of which a length in a horizontal direction perpendicular to the stacking direction is larger than a length in a width direction perpendicular to the stacking direction and the horizontal direction; and
   a second antenna layer extending from the plurality of first pattern layers in at least one of an uppermost portion or a lowermost portion of the first antenna layer, to have a radiation length in the horizontal direction and the width direction in which the second antenna layer extends.

2. The antenna substrate of claim 1, wherein, in the stacking direction, the second antenna layer has a length smaller than a length of the first antenna layer.

3. The antenna substrate of claim 1, wherein a length of each first conductive via layer in the horizontal direction is larger than a length thereof in the stacking direction.

4. The antenna substrate of claim 1, wherein each first conductive via layer is disposed in a stack via shape in which each first conductive via layer is interposed between two adjacent first pattern layers in the stacking direction.

5. The antenna substrate of claim 1, wherein a length a portion of a first conductive via layer close to the corresponding first pattern layer is larger than a length of a portion of the first conductive via layer farther from the corresponding first pattern layer.

6. The antenna substrate of claim 1, wherein a side surface of each first conductive via layer has a tapered shape or an hourglass shape in the stacking direction.

7. The antenna substrate of claim 1, further comprising:
   a plurality of second pattern layers including at least one second pattern layer that is spaced apart from the first pattern layers on a cross-section and stacked in the plurality of insulating layers, respectively, in the stacking direction; and
   a plurality of second conductive via layers connecting the second pattern layers to one another penetrating through the insulating layers, respectively, in the stacking direction.

8. The antenna substrate of claim 7, wherein at least one of the second pattern layers is electrically connected to the plurality of first pattern layers.

9. The antenna substrate of claim 7, further comprising a passivation layer disposed on at least one of an uppermost insulating layer or a lowermost insulating layer in the stacking direction.

10. An antenna substrate comprising:
    a body including a plurality of insulating layers stacked in a stacking direction;
    a first antenna layer including a plurality of first pattern layers disposed on the plurality of insulating layers, respectively, and a plurality of first conductive via layers respectively penetrating through the plurality of insulating layers to connect the plurality of first pattern layers in the stacking direction, each of the plurality of first conductive via layers having a bar shape of which a length in a horizontal direction perpendicular to the stacking direction is larger than a length in a width direction perpendicular to the stacking direction and the horizontal direction; and
    a second antenna layer extending in at least one of an uppermost portion or a lowermost portion of the first antenna layer on the insulating layers of the body, wherein each first pattern layer has a length larger than each first conductive via layer in the horizontal direction and the width direction in which the second antenna layer extends.

11. The antenna substrate of claim 10, wherein, when viewed in a cross- section of the first antenna layer in the stacking and horizontal directions, a cross-sectional area of the first antenna layer is greater than a cross-sectional area of the second antenna layer.

12. The antenna substrate of claim 11, wherein the first antenna layer and the second antenna layer constitute a patch antenna.

13. The antenna substrate of claim 10, further comprising:
    a plurality of second pattern layers including at least one second pattern layer that is spaced apart from the first pattern layers on a cross-section and stacked in the plurality of insulating layers, respectively, in the stacking direction; and
    a plurality of second conductive via layers penetrating through the plurality of insulating layers in the stacking direction, respectively, to connect the plurality of second pattern layers to one another.

14. The antenna substrate of claim 13, wherein at least one of the second pattern layers is electrically connected to the plurality of first pattern layers.

15. The antenna substrate of claim 13, further comprising:
    an electronic component disposed on the body in a surface mounting form and electrically connected to at least one of the plurality of second pattern layers,
    wherein the electronic component includes at least one of a power management integrated circuit (PMIC), a radio frequency integrated circuit (RFRC), or a passive component.

16. An antenna substrate comprising:
    a body including a plurality of insulating layers stacked in a stacking direction;
    a first antenna layer including a plurality of first pattern layers disposed on the plurality of insulating layers, respectively, and a plurality of first conductive via layers respectively penetrating through the plurality of insulating layers to connect the plurality of first pattern layers in the stacking direction; and a second antenna layer extending in at least one of an uppermost portion or a lowermost portion of the first antenna layer on the insulating layers of the body, wherein the plurality of first pattern layers are connected to each other via the plurality of first conductive via layers in all of cross-sections of the first antenna layer that is cut in the stacking direction and a horizontal direction along a width direction in which the second antenna layer extends, the horizontal direction being perpendicular to the stacking direction and the width direction.

17. The antenna substrate of claim 16, wherein, in the stacking direction, a length of the second antenna layer is smaller than a length of the first antenna layer.

18. The antenna substrate of claim 16, wherein, in the width direction, a length of the second antenna layer is larger than a length of the first antenna layer.

19. The antenna substrate of claim 16, wherein the second antenna layer includes an upper antenna layer extending in the width direction from an uppermost layer of the plurality of first pattern layers, and a lower antenna layer extending in the width direction from a lowermost layer of the plurality of first pattern layers.

20. The antenna substrate of claim 16, further comprising:

a plurality of second pattern layers including at least one second pattern layer that is spaced apart from the first pattern layers on a cross-section and stacked in the plurality of insulating layers, respectively, in the stacking direction; and a plurality of second conductive via layers connecting the second pattern layers to one another penetrating through the insulating layers, respectively, in the stacking direction.

* * * * *